United States Patent [19]
Johnston et al.

[11] Patent Number: 5,764,577
[45] Date of Patent: Jun. 9, 1998

[54] FUSLELESS MEMORY REPAIR SYSTEM AND METHOD OF OPERATION

[75] Inventors: Thomas Kevin Johnston, Austin; William Daune Atwell, Jr., Spicewood; David Russell Tipple, Austin, all of Tex.

[73] Assignee: Motorola, Inc., Schaumburg, Ill.

[21] Appl. No.: 834,960

[22] Filed: Apr. 7, 1997

[51] Int. Cl.$^6$ .................................................. G11C 7/00
[52] U.S. Cl. ........................................ 365/200; 365/201
[58] Field of Search ................................. 365/200, 201

[56] References Cited

U.S. PATENT DOCUMENTS

| | | | |
|---|---|---|---|
| 5,416,740 | 5/1995 | Fujita et al. | 365/200 |
| 5,430,678 | 7/1995 | Tomita et al. | 365/200 |
| 5,535,161 | 7/1996 | Kato | 365/200 |
| 5,544,106 | 8/1996 | Koike | 365/200 |

*Primary Examiner*—Son T. Dinh
*Attorney, Agent, or Firm*—Keith E. Witek

[57] ABSTRACT

A method and system for performing memory repair via redundant rows of memory uses memory elements (208 and 210) for redundant row selection instead of conventional fuses. An on-chip test controller (110) is capable of testing memory rows (106) either at wafer probe, at final testing after manufacturing, or after memory chip packaging and/or final sale to end users. If this testing identifies faulty memory rows in the memory array at any time, the electrically programmable memory elements (208 and 210) can be internally re-programmed to create a new memory configuration which includes redundant memory rows (108). This new memory configuration is enabled in order to remove the newly-detected and previously-detected faulty memory rows from active memory in the memory array.

37 Claims, 3 Drawing Sheets

FUSELESS MEMORY REPAIR SYSTEM AND METHOD OF OPERATION

FIELD OF THE INVENTION

The present invention relates generally to memory integrated circuit manufacturing, and more particularly to, fuseless repair of memory arrays using redundant memory cells.

BACKGROUND OF THE INVENTION

The significance of defects in memory systems is such that considerable effort has been invested to provide repairable arrays using redundant memory array rows, redundant memory array columns, or both. These redundant/spare memory lines (i.e., rows or columns) are not activated for use in the memory array unless post-manufacture testing indicates that a defect exists in the main memory array structure. When a fault is detected in the main memory array structure, a redundant memory array row or column, is substituted for the row or column containing the fault. The final result is that the memory array is fully functional and the fault in the main array is avoided by activating a redundant line to substitute for the faulty memory line (i.e., either row or column). The final yield of a memory system incorporating such redundant structures is greatly improved relative to a memory system in which a single failure results in the whole memory system being scrapped.

Known redundant structures fall into one of two broad types of redundant architectures: (1) cache/tag architectures; and (2) fuse-based architectures.

In a cache/tag based architecture, a small array of memory lines and corresponding address tags are placed on-chip with the memory array. When defects are discovered during testing, individual ones of the cache lines are mapped, via the tags, to replace the faulty memory lines. The mapping is accomplished by storing the address or "tag" of the defective line(s) into the tag associated with one or more of the cached replacement line(s).

Subsequent accesses of the faulty main array address use the memory cells in the cached replacement line. Although this solution is flexible and modular, it requires a compare operation between each stored tag and each input address for each memory access. This comparison typically affects the access time of the memory system adversely. Also, cache/tag architectures are generally complex structures, require significant space to implement, and consume excessive power.

In a fuse-based architecture, a replacement row is selected by blowing a fuse associated with a defective memory row. Once the fuse is blown, the defective address is remapped either: (1) directly to a redundant memory row; or (2) to the next functional memory row in the memory array. In the second case, every other subsequent memory row (which is not defective) is also remapped to the next subsequent memory. This style of redundancy is also known as a "push-down" architecture since a fault is corrected by incrementing all memory row pointers to point to a (row+1). The last row in the memory array now points to a redundant row in the memory array.

Both fuse-based strategies outlined above require a process that supports fuse formation. These processes can be more complex than typical integrated circuit (IC) processes. The fuses are typically formed in a lower conductive layer of material (such as a second level of polysilicon). Therefore, complex etch processing is used to etch through passivation, inter-level dielectrics, nitride layers, etch and polish stop layer, and the like to expose the fuse to laser operations. These etches to form a fuse opening are complex and may adversely affect yield. Further, the process of blowing fuses requires an additional assembly/laser step after test. The process of blowing the fuse with a laser vaporizes the fuse leaving particle residue on the die surface and within fuse openings. This residue is sometimes conductive resulting in electrical short circuits or leakage paths. Also, fused repair must be performed before packaging the die, must be performed in the factory, and can never be undone or used later in the life of the memory system. Therefore, once a fuse is blown, it cannot be "unblown". In addition, once the IC is packaged, the laser repair operation cannot be performed through the IC package and subsequent end-user repair is impossible which adversely affects IC lifetime.

Therefore, a need exists for a memory repair redundancy system which is more versatile and safe than fuse-based repair and more area-efficient and less-complex than cache-based repair.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF THE DRAWINGS

Generally, the method and apparatus taught herein uses a non-fused based and non-cache based system to enable memory repair using redundant memory array rows and/or columns. Unlike the cache-based system, the system taught herein does not need additional compare operations which slow memory access times. Also, the method taught herein does not require CAMs which significantly reduces surface area overhead which is critical in high-performance microprocessor design and high-performance/high-density memory chips. Unlike the fuse based solutions, the process is simpler and does not require a complex etch to form fuse openings. There is no fuse residue due to the laser blowing operation. Unlike a fuse which can only be altered once and never "un-blown", the system taught herein is fully reprogrammable so that memory repair via redundant row selection can be performed more than once. In addition, additional repair or new redundant row activation can be performed after packaging many years after the part is used by an end-user thereby allowing an end-user to obtain more useful life and less "down-time" from the memory product.

Generally, each row (or column since row and column are interchangeable herein) is associated with a row selection circuit. Each row selection circuit contains an electrically-programmable memory element. If this memory element is programmed with a first logic value (e.g., a logic one), then the normal main memory array is accessed/enabled. If an error is found in row N of the array, the memory element associated with row N is electrically written to a second logic value (e.g. logic zero) which enables a redundant row to replace the faulty row N or pushes down the array using a "push-down" method. The electrically-erasable memory elements can be reprogrammed at a later time to a new memory configuration containing more or fewer redundant memory rows/columns as needed.

Generally, the present invention can be understood with reference to FIGS. 1-3 hereinbelow.

Figure 1:
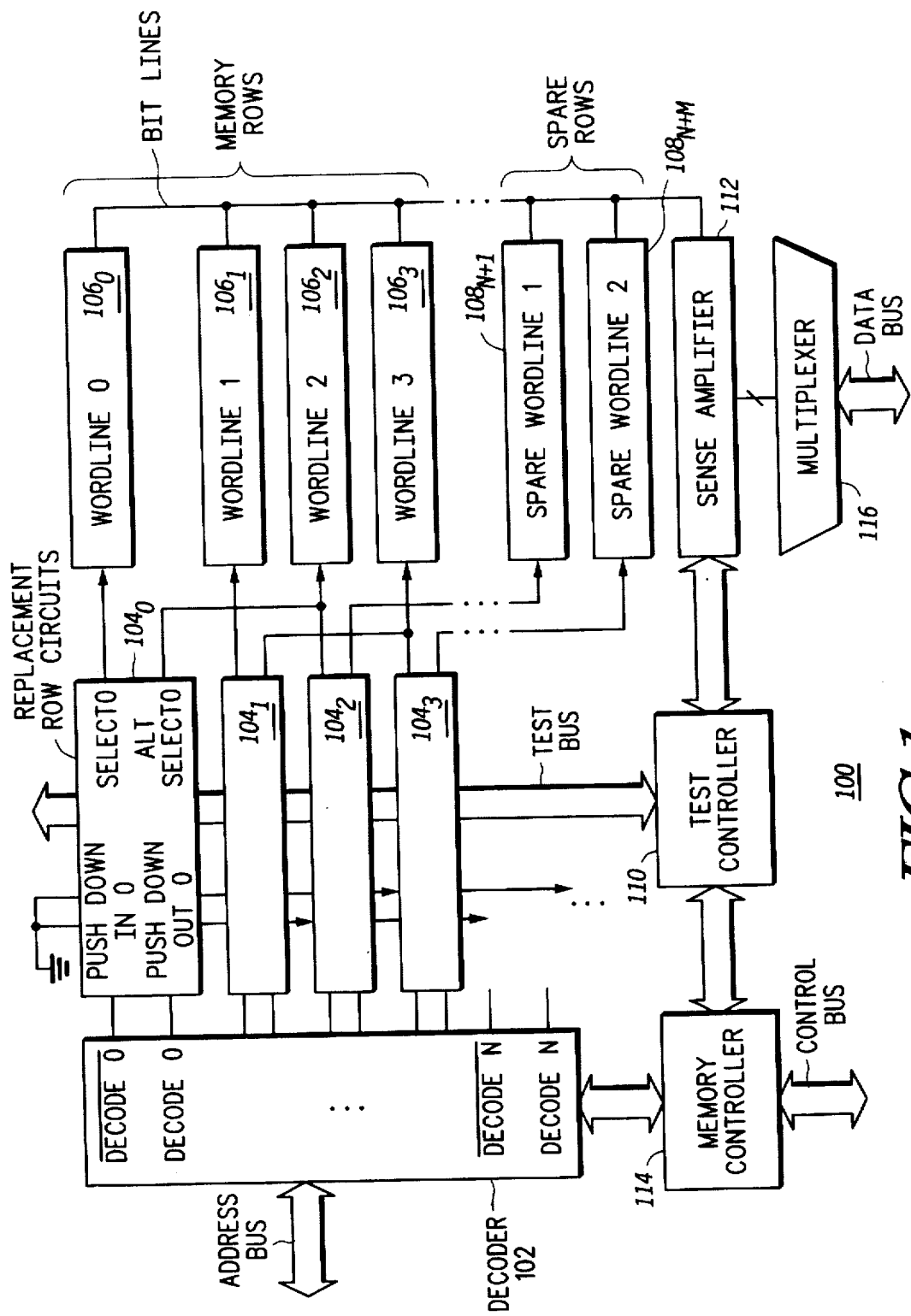
FIG. 1 depicts a block diagram of a memory system constructed in accordance with the present invention.

FIG. 1 depicts a block diagram of a memory system 100 constructed in accordance with the present invention. Memory system 100 incorporates novel circuitry to engage a redundant memory row in the event of a memory row failure.

According to one aspect of the present invention, no fuses are required to manufacture the system. The main advantages of this omission are that certain process steps associated with fuses are omitted in the teachings herein saving time and improving yield. There is no residue from blowing the fuses which may contaminate the memory system, and the system taught herein can be reconfigured or reprogrammed at any time, even after IC packaging, unlike fuses.

According to another aspect of the present invention, memory rows are grouped into sequential chains which are either block-grouped or modulo-interleave grouped with respect to each other. Assume a memory array contains 20 main memory rows of cells. These 20 rows of main memory can be rank-ordered (i.e., numbered sequentially) from 1 to 20 by the position in the array (i.e., top-to-bottom, left-to-right, etc.). The block-grouped architecture versus the modulo or interleaved architecture is discussed in detail below using this example 20 row memory architecture.

In one block-grouped embodiment, the rows 1-10 are sequentially chained in a first sequential push down chain and rows 11-20 are sequentially chained in a second sequential push down chain. Each sequential chain has at least one associated redundant row of cells. Therefore, the first sequential chain of rows 1-10 will be coupled to or associated with at least one redundant row of memory (a first redundant row) and the second sequential chain of rows 11-20 will be coupled along with or associated with at least one other redundant row of memory (a second redundant row). If a fault is detected in one of the main memory rows 1-10, the electrically-erasable elements associated with each rows 1-10 are programmed to perform a push-down process to enable the first redundant row and disable the faulty row. If a fault is detected in one of the rows 11-20, the electrically-erasable elements associated with each rows 11-20 are programmed to perform a push-down process to enable the second redundant row while bypassing/disabling the faulty row. Notice that if only the first and second redundant rows are provided in the architecture, then two faulty main memory rows within the block-grouped rows 1-10 cannot be fixed (only one redundant row, the first redundant row, is available for the rows 1-10) and the part will be deemed "unfixable" and be scrapped.

In another block-grouped embodiment, five redundant rows can be provided in the architecture. The main memory rows 1-4 can be associated with the first redundant row. The main memory rows 5-8 can be associated with the second redundant row. The main memory rows 9-12 can be associated with the third redundant row. The main memory rows 13-16 can be associated with the fourth redundant row. The main memory rows 17-20 can be associated with the fifth redundant row. This five-block architecture allows for up to five faulty rows to be corrected without scrapping the part as long as no one group of four rows contains more than one bad row requiring replacement.

Experimentation has shown that as memory cells decrease in size, it is likely that multiple physically-adjacent rows may be damaged or rendered faulty by a single contiguous physical defect. In these situations, the grouped method discussed above is not usually optimal. If two or more adjacent rows are likely to be rendered faulty, then a modulo or interleaved row grouping scheme should be used to form interleaved sequential chains of grouped memory rows. It is this interleaved architecture which is detailed graphically in FIG. 1 and discussed in more detail below.

Again, assume a memory array contains 20 main memory rows of cells. These 20 rows of main memory can be rank-ordered (i.e., numbered sequentially) from 1 to 20 by the physical position of the rows in the array (i.e., top-to-bottom, left-to-right, etc.). In one interleaved embodiment, as illustrated in FIG. 1, two sequential chains of rows can be made. One sequential chain used to group all of the odd memory rows (e.g., rows 1, 3, 5, . . . 19) into a first sequential chain and a second sequential chain being used to group together all of the even memory rows (e.g. rows 2, 4, 6, . . . 20). Each chain (both the odd row chain and even row chain) is associated or sequentially coupled with at least one redundant memory row. In an architecture with only one redundant row per interleaved group, one odd row and one even row can fail and be rendered fully repairable without need for scrapping the part. With this scheme, two physically adjacent rows can be nonfunctional and be corrected while correction of two or more physically adjacent rows may not be possible in the block-grouping architecture discussed hereinabove. An architecture which block-groups memory rows on a higher architectural level and interleave-groups within blocks is also possible and desirable in some architectures.

In another interleaved embodiment, the 20 rows of memory can be grouped into four interleaved sequential chains where each of these four chains is associated with one of four redundant memory rows. In this embodiment, the rows 1, 5, 9, 13, and 17 share a first redundant row in the memory array. The rows 2, 6, 10, 14, and 18 share a second redundant row in the memory array. The rows 3, 7, 11, 15, and 19 share a third redundant row in the memory array. Finally, the rows 4, 8, 12, 16, and 20 share a fourth redundant row in the memory array. In this configuration, up to four rows of memory can fail in the main array and still be fixed to render a functional IC. These four rows may even be physically adjacent to one another in the memory array and still be fully correctable unlike the block-ordered approach outlined hereinabove. In general, N rows of main memory can be grouped into M sequential chains of one or more main memory rows where each sequential chain contains one or more redundant rows and roughly N/M main memory cells (N and M being finite, positive integers).

In addition, multiple redundant word lines in the memory array can be dedicated to each sequential chain of main memory rows in a single memory system without the cost, surface area, and complexity associated with prior cache based redundancy architectures.

According to a third aspect of the present invention, testing of the memory system may be performed (1) by the memory system manufacturer immediately after manufacture or (2) by the end user (computer/system purchaser), operating system of a computer, or by the memory system itself at any point during the life of the memory system. Such flexibility accommodates failures which may occur even years after manufacture thereby utilizing redundant memory capacity far more efficiently than fuse-based solutions.

Continuing with FIG. 1, memory system 100 receives address signals on an ADDRESS BUS at an input of a decoder 102. Decoder 102 generates N differential decode signal pairs DECODE0/$\overline{\text{DECODE0}}$ through DECODEN/$\overline{\text{DECODEN}}$ outputs (where N is an integer). Each N+1 pair of decode signals is exclusively enabled by a unique address from the ADDRESS BUS although some special purpose architectures may enable more than one memory location per unique address. These N+1 differential decode signal pairs are coupled to N+1 replacement row selection circuits $104_0$ through $104_N$. Each one of the N+1 replacement row selection circuits $104_0$ through $104_N$ generates a SELECT signal and an ALT SELECT signal. An ith one of the SELECT signals (where i=a value from 0 to N) is connected to an ith one of N+1 memory rows $106_0$ through $106_N$ as illustrated in FIG. 1. In other words, select circuit $104_3$ is coupled to wordline $106_3$ (also referred to as memory row $106_3$). Additionally, the ith ALT SELECT signal is coupled to the (i+M)th memory row $106_0$ through $106_N$, where M is the interleave factor of the memory system 100 where M is typically less than N. In FIG. 2, an interleave factor of 2 is used so that all odd memory rows are within a first sequential chain and all even memory are in a second sequential chain as per the connections made between elements 104 in FIG. 1. The final M ones of the N+1 ALT SELECT signals are coupled to a differing one of M spare rows $108_{N+1}$ through $108_{N+M}$. In other words, at least M redundant memory rows are used to support M sequential chains. However, more logic can be added to the circuit of FIG. 2 to support, for example, two or more redundant memory rows per sequential chain (e.g. the total number of redundant rows may be L*M where L is a finite positive integer greater than zero where there are L redundant rows allocated to each sequential chain).

Continuing with the N+1 replacement row selection circuits $104_0$ through $104_N$, each selection circuit $104_0$ through $104_N$ also receives a PUSH DOWN IN input and generates a PUSH DOWN OUT output. The first M PUSH DOWN IN inputs are connected to a voltage supply labeled ground (GND) as illustrated in FIG. 1 since there are no preceding memory rows at the beginning of a sequential chain of rows. Otherwise, when there are preceding rows existing in the sequential chain (the selection circuit is the second or subsequent selection circuit in the chain), then the (i)th one of the PUSH DOWN IN inputs is coupled to the (i-M)th PUSH DOWN OUT output. The final M PUSH DOWN OUT outputs are coupled to a test controller 110 since there are no subsequent elements in the sequential chain at the end of the sequential chain. These M lines provided into the test controller from the circuits 104 (not specifically illustrated in FIG. 1) are useful since the test controller can determine, via these M feedback signals, if the push-down operation occurred properly in each specific sequential chain.

Test controller 110 also supplies a TEST BUS to the N+1 replacement row circuits $104_0$ through $104_N$. The TEST BUS comprises a FAULT signal, an ENGAGE signal, and a RESET signal. The FAULT signal is used to write selectively to memory elements within at least one of the circuits 104 (see FIG. 2 element 400) to enable a "push-down" operation in a sequential chain and enable at least one redundant memory row. The ENGAGE signal applies the "push-down" changes resulting from use of the FAULT signal within the circuits 104 to the memory array to physically and selectively enable the configuration of rows 106 and rows 108 as are needed to render the memory structure fully functional. The RESET signal clears all of the memory elements within the circuits 104 (see FIG. 2) TEST BUS is more fully described below in connection with FIG. 2.

Test controller 110 is bi-directionally coupled to a sense amplifier 112 and to a memory controller 114. Sense amplifier 112 is coupled, by a plurality of bit lines, to memory rows $106_0$ through $106_N$ and to spare rows $108_{N+1}$ through $108_{N+M}$. Sense amplifier 112 outputs a selected memory row to multiplexer 116 which itself is coupled to the external environment through a DATA BUS. Memory controller 114 is bi-directionally coupled to the external world through a CONTROL BUS and is coupled to decoder 102 as illustrated.

In the depicted embodiment, the interleave factor, or M, equals 2. With M=2, the PUSH DOWN IN terminals and PUSH DOWN OUT terminals in FIG. 1 are coupled so that all even rank-ordered memory rows and all even rank-ordered selection circuits (i.e., elements 104 and 106 subscripted as 0, 2, 4, . . . 18 in FIG. 1) are formed into a first sequential chain which is associated with spare/redundant word line 1 of FIG. 1. With M=2 in FIG. 1, the PUSH DOWN IN terminals and PUSH DOWN OUT terminals of elements 104 are coupled so that all odd rank-ordered memory rows and all even rank-ordered selection circuits (i.e., elements 104 and 106 subscripted as 1, 3, 5, . . . 19 in FIG. 1) are formed into a second sequential chain which is associated with spare/redundant word line 2 of FIG. 1. Therefore, the interleave factor (M) defines how many sequential chains of replacement row selection circuits 104 exist in memory system 100. As depicted in FIG. 1, two sequential chains of replacement row circuits are formed and arranged in an even ordered chain and an odd ordered chain. It should be understood, however, that the interleave factor, M, may equal any number greater than or equal to 1. The interleave factor, M, also determines the number of spare/redundant rows $108_{N+1}$ through $108_{N+M}$. Each sequential chain will typically have one associated redundant row 108 so that only one faulty row per chain may be repaired. However, additional coupling logic 402 can be added to FIG. 2 to allow for a SELECT, and an ALT SELECT 1 through an ALT SELECT K where K is an integer greater than one.

Figure 2:
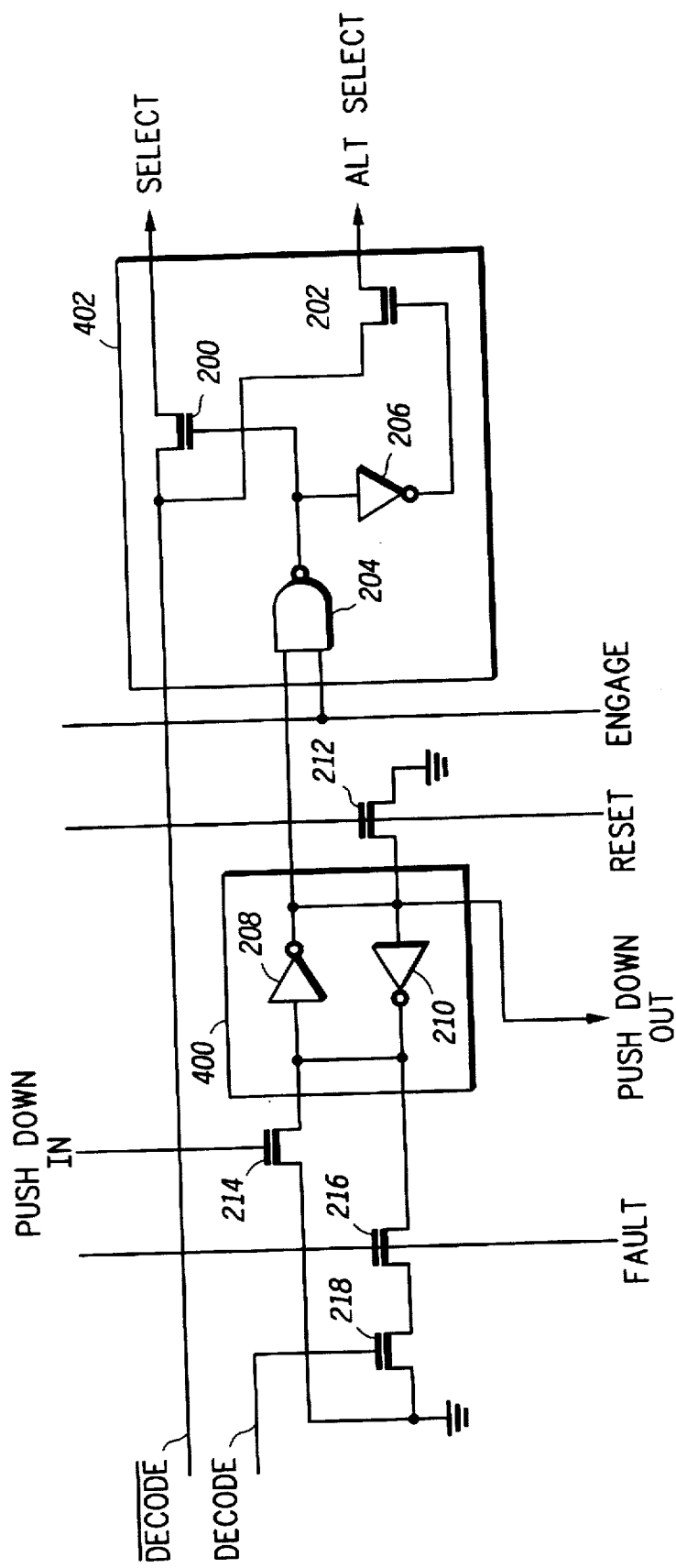
FIG. 2 depicts a circuit diagram of a replacement row circuit illustrated in FIG. 1 in accordance with the present invention.

In other words, the logic 402 of FIG. 2 may be augmented to enable each selection circuit to not only "push-down" by one row but push-down by two or more rows.

The operation of memory system 100 may be conveniently described by breaking its mode of operations into two parts: (1) a normal read/write data transfer and (2) a test mode operation.

In a normal read/write data transfer, an address is presented to decoder 102 via the ADDRESS BUS. Decoder 102 then asserts one of the differential decode signal pairs, DECODE0/$\overline{\text{DECODE0}}$ through DECODEN/$\overline{\text{DECODEN}}$, corresponding to the memory row which is associated with the desired memory address. The decode signals are then routed to one of N possible memory rows $106_0$ through $106_N$ or to one of M spare rows $108_{N+1}$ though $108_{N+M}$ as configured by the selection circuits 104. The particular memory row or spare/redundant row to which the decode signals are routed is described more fully below in connection with FIG. 2.

During the normal read/write operation, one memory row or spare row is coupled by a plurality of bit lines in FIG. 1 to sense amplifier 112, then to multiplexer 116, and ultimately to the external environment via the DATA BUS. In a read data transfer, data stored in one memory row or spare row is sensed by sense amplifier 112 and output through multiplexer 116 to the external environment. In a write type data transfer, data presented on DATA BUS, is routed by multiplexer 116 to sense amplifier 112 where it is driven into a particular one of the memory rows or spare rows selected by the decoder signals from decoder 102. This new value overrides any pre-existing value in that particular memory location. Memory controller 114 controls the particular details of the read and write data transfer responsive to control signals received via the CONTROL BUS.

When in a test mode of operation, either a built in self test (BIST) structure or an external tester, such as test controller 110, a microprocessor, an on-chip CPU, microcontroller, etc, causes decoder 102 and sense amplifier 112 to systematically test the read, write, and storage functionality of memory rows $106_0$ through $106_N$. These tests include writing and reading various test patterns such as 0000, 1111, 0101, 1010, 0011, 1100, etc. to the memory array locations. In addition, the reads and writes are performed in specific orders which are known to flush out various faults which may be either design or manufacturing defects. If test controller 110 determines that no memory rows $106_0$ through $106_N$ are defective, then test controller 110 causes replacement row selection circuits $104_0$ through $104_N$ to directly map the N+1 differential decode signal pairs DECODE0/$\overline{DECODE0}$ through DECODEN/$\overline{DECODEN}$ directly to memory rows $106_0$ through $106_N$, respectively. In other words, if no faults are discovered in the main memory array containing rows 106, then the redundant rows 108 are not activated at this time by memory element write operations within the selection circuits 104 (see FIG. 2).

Conversely, if test controller 110 determines that one or more of the memory rows $106_0$ through $106_N$ are defective, then test controller 110 causes replacement row circuits $104_0$ through $104_N$ to remap one or more of the N+1 differential decode signal pairs DECODE0/$\overline{DECODE0}$ through DECODEN/$\overline{DECODEN}$ away from the defective memory row and to one or more of the spare/redundant rows $108_{N+1}$ through $108_{N+M}$. Specifically, each set of replacement row circuits $104_0$ through $104_N$ shifts the particular one of the differential decode signal pairs DECODE0/$\overline{DECODE0}$ through DECODEN/$\overline{DECODEN}$ away from the defective memory row and to the next memory row in a "push-down" manner (see TABLES 1 and 2 below). In essence, each replacement row selection circuit $104_0$ through $104_N$ which is both in the same sequential chain assigned to the faulty row and subsequent to the faulty row in subscripted rank-order shifts its respective differential decode signal pairs DECODE0/$\overline{DECODE0}$ through DECODEN/$\overline{DECODEN}$ to a next subsequent memory row $106_0$ through $106_N$ or to a redundant row if the selection circuit is located at the end of this specific sequential chain. It should be understood that, in the event of a defective memory row $106_0$ through $106_N$, the final differential decode signal pair of DECODE0/$\overline{DECODE0}$ through DECODEN/$\overline{DECODEN}$ in the sequential chain will be shifted to one of the spare rows $108_{N+1}$ through $108_{N+M}$. As described above, the replacement row circuits $104_0$ through $104_N$ form independent and interleaved sequential chains of circuits. Therefore, when one pair of differential decode signal pairs DECODE0/$\overline{DECODE0}$ through DECODEN/$\overline{DECODEN}$ are shifted by one, then the DECODE signals are actually shifted by M memory rows in an interleaved architecture.

For illustration, FIG. 1 illustrates two sequential chains, one sequential chain containing all the even subscripted elements 104 (i.e., rows $104_0, 104_2, \ldots 104_{18}$) and another sequential chain containing all the odd subscripted elements 104 (i.e., rows $104_1, 104_3, \ldots 104_{19}$). Initially, all selection circuits $104_i$ are selecting memory rows $106_i$ (where i=0 . . . 19) via the SELECT signals of FIG. 2 (the whole main array is selected and intact). Therefore, the following table indicates the configuration of the memory array:

TABLE 1

| Selection Circuits in the Odd Sequential Chain by Rank-Ordered Reference Numbers | The Memory Row Which is Selected by the Selection Circuit in the 1st Column |
|---|---|
| $104_1$ | $106_1$ |
| $104_3$ | $106_3$ |
| $104_5$ | $106_5$ |
| $104_7$ | $106_7$ |
| $104_9$ | $106_9$ |
| $104_{11}$ | $106_{11}$ |
| $104_{13}$ | $106_{13}$ |
| $104_{15}$ | $106_{15}$ |
| $104_{17}$ | $106_{17}$ |
| $104_{19}$ | $106_{19}$ |

Now assume that the memory row $106_7$ which is accessed by selection circuit $104_7$ in TABLE 1 above has a fault as detected by the test controller 110. In this case, the selection circuit $104_7$ and all subsequent selection circuits within that odd-numbered chain (e.g., selection circuits $104_9, 104_{11}, \ldots 104_{19}$) will be programmed to select the i+Mth elements so that the following selection will now occur:

TABLE 2

| Selection Circuits by Rank-Ordered Reference Numbers | The Memory Row Which is Selected by the Selection Circuit in the 1st Column |
|---|---|
| $104_1$ | $106_1$ |
| $104_3$ | $106_3$ |
| $104_5$ | $106_5$ |
| $104_7$ | $106_9$ |
| $104_9$ | $106_{11}$ |
| $104_{11}$ | $106_{13}$ |
| $104_{13}$ | $106_{15}$ |
| $104_{15}$ | $106_{17}$ |
| $104_{17}$ | $106_{19}$ |
| $104_{19}$ | (Spare Wordline 2) $108_{N+M}$ |

Note in Table 2 that the faulty memory row $106_7$ is avoided in favor of a redundant row 108. In TABLE 2, the selection circuits are programmed such that the selection circuits $104_1$ through $104_5$ access memory rows via asserted SELECT signals whereas the selection circuits $104_7$ through $104_{19}$ access memory rows via asserted ALT SELECT signals thereby bypassing the faulty row $106_7$. TABLE 2 clearly indicates why this method is called a "push-down" approach. All subsequent functional rows from the faulting row are "pushed down" in the decoding scheme until the last row in the sequential chain is forced to pick up a redundant row 108.

One skilled in the art would readily appreciate that the interleaved aspect of the present invention allows physically adjacent defective rows to be repaired with little cost and complexity via the above illustrated odd/even push-down scheme. A designer of memory system 100 selects the interleave factor, M, based on a compromise of the yield enhancing benefits of being able to repair faulty rows versus the disadvantage of increasing the die size by the addition of spare rows $108_{N+1}$ through $108_{N+M}$. A cleaner process will result in a reduced interleave factor (M).

FIG. 2 depicts a circuit diagram of a single replacement row circuit 104 previously illustrated in FIG. 1. Circuit 104 contains a memory element 400 and a coupling circuit 402. Replacement row circuit 104 will generate one of either an asserted SELECT signal or an asserted ALT SELECT signal. The SELECT signal is asserted if a first logic state is stored in the memory element 400 and the ALT SELECT signal is asserted if a second logic state is stored in the memory element 400. The first logic state is the default state where the select circuit 104 was not forced to perform a "push-down" operation due to a fault. The second logic value is stored in the memory element 400 when the circuit 104 is forced to perform a "push-down" operation.

A first current electrode of an n-type transistor 200 and a first current electrode of an n-type transistor 202 generate the signals SELECT and ALT SELECT, respectively, from the coupling circuit 402. A second current electrode of transistors 200 and 202 are each connected to the input $\overline{\text{DECODE}}$ from the decoder 102 of FIG. 1. Each of the control electrodes of gates 200 and 202 is connected to an output of an NAND gate 204 and to an output of an inverter 206, respectively. An input of inverter 206 is also connected to the output of NAND gate 204 within the coupling circuit 402. A first input of NAND gate 204 receives the control signal ENGAGE. ENGAGE is used to temporarily prevent the application of the logic value stored in the memory element 400 to the memory array of FIG. 1 during test and push-down procedures.

In general, the memory element 400 contains circular-coupled inverters referred to as a keeper circuit or used within static random access memory (SRAM) cell design. Alternatives to the use of SRAM memory elements are DRAM elements containing a capacitor and a transistor, an EEPROM device, a flash device, an EPROM device, a non-volatile ferroelectric cell, and the like. The SRAM cell is preferred over the other cells due to its ease of integration with other logic devices. When using the SRAM storage structure for circuit 400 as shown in FIG. 2, a second input of NAND gate 204 receives a stored logic value output of an inverter 208. The output of inverter 208 is also connected to an input of an inverter 210 and to a first current electrode of an n-type transistor 212. An output of inverter 210 is connected to an input of inverter 208. Inverters 208 and 210 form the memory element by circularly storing a single stable bit of information. A control electrode of transistor 212 is coupled to the control signal RESET and a second current electrode of the transistor 212 is coupled to the voltage supply ground (GND). The RESET signal is used to RESET the memory element 400 to a default state to enable reprogramming or reconfiguring of the memory rows 106 and 108 (see FIG. 1). The output of inverter 208 generates the control signal PUSH DOWN OUT which, when connected serially with a PUSH DOWN IN signal of another circuit 104 is used to create the sequential chains taught herein.

The input of inverter 208 is connected to a first current electrode of an n-type transistor 214 and to a first current electrode of an n-type transistor 216. A control electrode and a second current electrode of transistor 214 are coupled to the control signal PUSH DOWN IN and to the voltage supply ground (GND), respectively. A control electrode and a second current electrode of transistor 216 are coupled to the control signal FAULT and to a first current electrode of an n-type 218, respectively. A control electrode and a second current electrode of transistor 218 are coupled to the DECODE signal and to the voltage supply ground (GND), respectively.

The operation of replacement row circuit 104 may be conveniently described with respect to the signals ENGAGE, RESET, and FAULT. When ENGAGE corresponds to a logic low value, then replacement row circuit 104 maps the input DECODE signal to the output SELECT signal directly. In preparation for testing memory system 100, the RESET signal may be asserted to write a predetermined reset value or default value into the memory element formed by circular-coupled inverters 208 and 210. This predetermined value (zero at the output of inverter 208) causes redundant row circuit 104 to directly map its input DECODE signal to its output SELECT signal in later modes of operation. As described above in connection with FIG. 1, an intelligent actor, such as test controller 110, tests each memory row $106_0$ though $106_N$ for its read, write, and storage capabilities. If a particular one of memory rows $106_0$ though $106_N$ fails, then test controller 110 will simultaneously assert the address of the defective memory row (which may be the same static address currently being asserted for testing) and the signal FAULT. This dual assertion of the FAULT signal and the decode signals associated with the faulty row flip the logic state stored in the memory element 400.

In addition, the output of inverter 208 will ripple downward to all subsequent memory elements 400 in subsequent circuits 104 which reside in the same sequential chain via proper interleaved or block coupling of the signals PUSH DOWN OUT with PUSH DOWN IN signals. The PUSH DOWN OUT signal propagates the change in status of the memory element 400 to the PUSH DOWN IN input of each subsequent replacement row circuit 104 in the sequential chain. In these subsequent circuits 104, the PUSH DOWN IN inputs will have the same effect as the simultaneous assertion of FAULT and DECODE in the selection circuit associated with the fault row (see the TABLES 1 and 2 herein).

Later, when testing is complete and logic values are set in the elements 400 for all circuits 104 of FIG. 1, test controller 110 will assert the signal ENGAGE transferring the logic states stored in the memory element formed by inverters 208 and 210 to the control electrodes of transistors 200 and 202. As described above this action may remap the DECODE signal input from the SELECT signal output to the ALT SELECT signal output within the coupling circuit 402 (see TABLES 1 and 2 herein).

Figure 3:
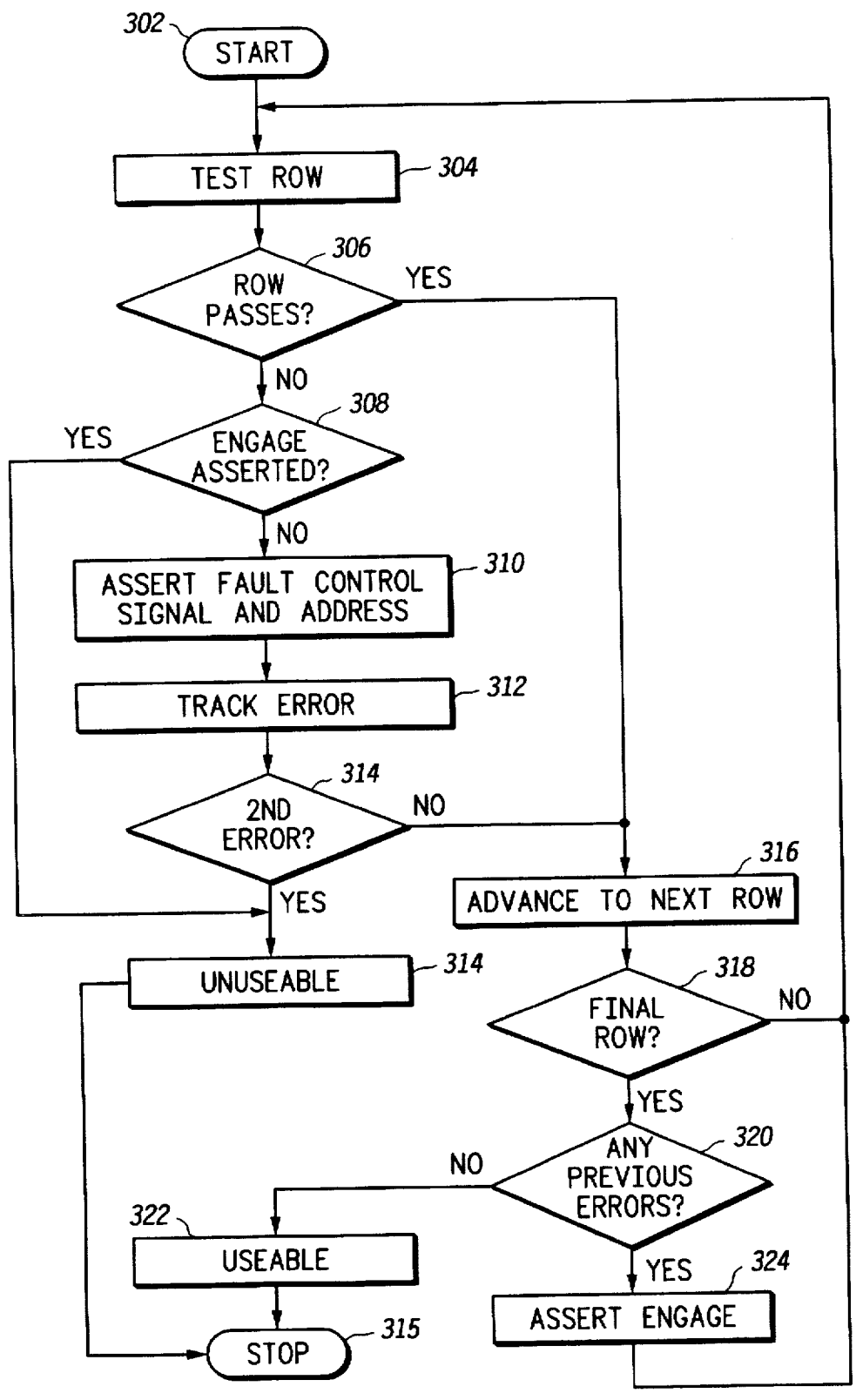
FIG. 3 depicts a flow diagram of a method of testing the memory device depicted in FIG. 1 in accordance with the present invention.

FIG. 3 depicts a flow diagram of a method 300 of testing the memory device 100 depicted in FIG. 1. Method 300 begins at a start step 302. In a next step 304, the test controller 110 tests each memory row $106_0$ through $106_N$, typically by reading and writing certain bit patterns into and out of each memory row. If a particular one of memory rows $106_0$ through $106_N$ is determined to contain a fault via a step 306, then test controller 110 determines if the signal ENGAGE is asserted, a step 308. The assertion of the signal ENGAGE indicates that an attempt has already been made by memory system 100 to map out failing ones of memory rows $106_0$ through $106_N$. In this case, no more repairs are possible and in order to do further repairs, the RESET signal must be asserted and testing begun from the beginning. Therefore, if the signal ENGAGE is asserted, then test controller 110 declares the memory device to be unusable via a step 314. Finally, method 300 terminates at a stop step 315.

If the signal ENGAGE is not asserted in step 308, then test controller 110 simultaneously asserts the signal FAULT and the address of the defective memory row $106_0$ through $106_N$ via a step 310. As described above in connection with FIG. 2, this simultaneous assertion of the faulty address and the FAULT signal writes a "fault-indicative" logic value into the memory element 400. Test controller 110 then tracks the number of failures in each sequential chain in a step 312. Tracking is needed to ensure that the number of redundant memory rows available to any one sequential chain have not been totally exhausted resulting in the inability to repair additional faulting rows within that sequential chain. In a step 314, test controller 110 determines whether the immediately preceding error was the first error in a particular sequential chain of memory rows $106_0$ through $106_N$. If the error is not the first error in the particular set (i.e. second error) and there is only one redundant memory row per sequential chain, then test controller 110 cannot repair beyond the first encountered fault in the chain.

Consequently, test controller 110 declares the memory device to be unusable due to lack of additional redundant rows via step 314. Finally, method 300 terminates at a stop step 315.

Instead, if the error/fault is the first error in the particular sequential chain, then test controller 110 can repair the error. In this case, test controller 110 continues to a step 316. Method 300 also continues to step 316 after determining that the previously tested memory row $106_0$ through $106_N$ passed its test in the step 306. In step 316, test controller 110 advances/increments an internal pointer which indicates what memory row $106_0$ through $106_N$ is under test. In a step 318, test controller 110 determines if it has tested each memory row $106_0$ through $106_N$. If test controller 110 has not tested each memory row $106_0$ through $106_N$, then test controller 110 returns to step 304 to continue to test each memory row $106_0$ through $106_N$ until all memory rows are completely tested.

If test controller 110 has tested each memory row $106_0$ through $106_N$, then test controller 110 determines if any previous error/fault was detected in memory system 100 via step 320. If no previous error was detected in memory system 100, then test controller 110 declares the memory system to be usable in a step 322. Method 300 then terminates at a stop step 315. If a previous error was detected in memory system 100 so that redundant memory was selected via "push-down" operations enabled via the step 310, then test controller 110 tests the spare rows $108_{N+1}$ through $108_{N+M}$ by asserting the ENGAGE signal in a step 324, and returning to test memory system 100 at step 304 in a step 324.

In one embodiment of the described invention, method 300 is implemented by test controller 110. It should be understood that method 300 may be performed by a factory tester, by an operating system running on a data processing system incorporating memory system 100, by a general-purpose CPU embedded with the memory array, or by any other control means. Further, method 300 may by executed immediately after memory system 100 is manufactured, each time memory system 100 is powered up, or at any other appropriate interval even after memory array packaging followed by years of end-user use.

While the present invention has been illustrated and described with reference to specific embodiments, further modifications and improvements will occur to those skilled in the art. For example, the present invention may be modified to provide redundant columns instead of, or in addition to, redundant rows. The memory element taught herein can be any element used to store a select value. The modulo interleaving taught herein can be performed in many different manners. It is to be understood, therefore, that this invention is not limited to the particular illustrated embodiment and that it is intended in the appended claims to cover all modifications that do not depart from the spirit and scope of this invention.

What is claimed is:

1. A memory system, comprising:
    a first plurality of memory cells grouped into a first set of memory cells;
    a second plurality of memory cells grouped into a second set of memory cells; and
    a set selection circuit coupled to the first set of memory cells and the second set of memory cells, the set selection circuit comprising:
        an electrically-programmable memory element coupled to receive decode input signals and a fault control signal; and
        a coupling circuit coupled to the electrically-programmable memory element, the coupling circuit having a first select output used to selectively access the first set of memory cells and a second select output used to selectively access the second set of memory cells, the first select output being enabled for use when a first logic value is stored in the memory element and the second select output being enabled for use when a second logic value is stored in the electrically-programmable memory element.

2. The memory system of claim 1 wherein the first set of memory cells and the second set of memory cells are rows of memory within a memory array.

3. The memory system of claim 1 wherein the first set of memory cells and the second set of memory cells are columns of memory within a memory array.

4. The memory system of claim 1 wherein the electrically-programmable memory element is a circular-coupled set of inverters.

5. The memory system of claim 1 wherein the electrically-programmable memory element is a nonvolatile memory element.

6. The memory system of claim 1 wherein the electrically-programmable memory element comprises a capacitor.

7. The memory system of claim 1 wherein the electrically-programmable memory element is coupled to a reset control signal which can be used to reset the electrically-programmable memory element to a default configuration.

8. The memory system of claim 1 wherein the coupling circuit is coupled to an engage control signal, the engage control signal: (1) preventing a logic value of the electrically-programmable memory element from affecting the selection of either the first or second plurality of memory cells when deasserted; and (2) allowing the logic value of the electrically-programmable memory element to select one of either the first or second plurality of memory cells when asserted.

9. The memory system of claim 1 wherein the electrically-programmable memory element is written when decode signals from a decoder and a fault control signal are both asserted.

10. The memory system of claim 1 wherein a test controller is used to test a memory array which contains the first and second plurality of memory cells to detect one or more faults in the memory array, whereby the test controller is used to initiate re-programming of the electrically-programmable memory element to compensate for one or more faults.

11. The memory system of claim 1 wherein the electrically-programmable memory element has an input coupled to an output of a preceding electrically-programmable memory element from a preceding set selection circuit.

12. The memory system of claim 1 wherein the electrically-programmable memory element has an output coupled to an input of a subsequent electrically-programmable memory element from a subsequent set selection circuit.

13. The memory system of claim 1 wherein the memory system contains a plurality of set selection circuits wherein each electrically-programmable memory element in the plurality of set selection circuits are connected into a sequential chain wherein a value written to a previous electrically-programmable memory element in the sequential chain affects subsequent electrically programmable memory elements in the sequential chain.

14. The memory system of claim 1 wherein the memory system contains a plurality of set selection circuits which are rank-ordered from 1 to N, the electrically-programmable memory element in every Mth set selection circuit from 1 to N being connected into a sequential chain wherein a value written to a previous electrically-programmable memory element in the sequential chain affects subsequent electrically programmable memory element in the sequential chain, N and M being integers where M is less than N.

15. A memory system, comprising:
  a first plurality of selection circuits, each selection circuit in the first plurality of selection circuits having an electrically-programmable memory element for storing a logic bit in one of either a first logic state or a second logic state, each electrically-programmable memory element within the first plurality of selection circuits being coupled in a first sequential chain through inputs and outputs of the electrically-programmable memory elements, the first plurality of selection circuits selecting only non-redundant memory segments when all of the electrically-programmable memory elements of the first plurality of selections circuits are in the first logic state, at least one of the selection circuits in the first plurality of selection circuits selecting a first line of redundant memory cells when at least one of the electrically-programmable memory elements in the first plurality of selection circuits is written to contain the second logic state; and
  a second plurality of selection circuits, each selection circuit in the second plurality of selection circuits having a electrically-programmable memory element for storing a logic bit in one of either a first logic state or a second logic state, each electrically-programmable memory element within the second plurality of selection circuits being coupled in a second sequential chain through inputs and outputs of the electrically-programmable memory elements, the second plurality of selection circuits selecting only non-redundant memory segments when all of the electrically-programmable memory elements of the second plurality of selections circuits are in the first logic state, at least one of the selection circuits in the second plurality of selection circuits selecting a second line of redundant memory cells when at least one of the electrically-programmable memory elements in the first plurality of selection circuits is written to contain the second logic state.

16. The memory system of claim 15 wherein the selection circuits are rank ordered from 1 to N wherein a rank-order for each selection circuit in the first plurality of selection circuits is less than the rank-order of for each selection circuit in the second plurality of selection circuits.

17. The memory system of claim 15 wherein the selection circuits are rank ordered from 1 to N wherein a rank-order for each selection circuit in the first plurality of selection circuits is a multiple of M beginning at one and the rank-order of each selection circuit in the second plurality of selection circuits is a multiple of M beginning at two where M is an integer greater than or equal to two.

18. The memory system of claim 15 wherein the electrically-programmable memory elements can be electrically erased by asserting a reset control signal.

19. The memory system of claim 15 wherein the first and second plurality of selection circuits are coupled to a memory array and a test controller is located on-chip with the first and second plurality of selection circuits, the test controller being used to determine memory faults, the test controller initiating re-programming operations which reprogram the electrically-programmable memory elements to enable memory out of the memory array which does not contain the memory faults.

20. A memory system, comprising:
  a first selection circuit having a first memory element and a first coupling circuit, the first memory element having an input controlled by a first control signal, a first output coupled to the first coupling circuit, and a second output, the first memory element: (1) being written to contain a first logic state to enable a primary line of memory cells in a memory array for use via the first coupling circuit; and (2) being written to contain a second logic state to enable an alternative line of memory cells in a memory array for use via the first coupling circuit;
  a second selection circuit adjacent the first selection circuit in the memory system and having a second memory element and a second coupling circuit, the second memory element having an input controlled by the first control signal, a first output coupled to the second coupling circuit, and a second output, the second memory element: (1) being written to contain a first logic state to enable a primary line of memory cells in a memory array for use via the second coupling circuit; and (2) being written to contain a second logic state to enable an alternative line of memory cells in a memory array for use via the second coupling circuit;
  a third selection circuit adjacent the second selection circuit in the memory system and having a third memory element and a third coupling circuit, the third memory element having an input controlled by the first control signal, a first output coupled to the third coupling circuit, and a second output, the third memory element: (1) being written to contain a first logic state to enable a primary line of memory cells in a memory array for use via the third coupling circuit; and (2) being written to contain a second logic state to enable an alternative line of memory cells in a memory array for use via the third coupling circuit; and
  a fourth selection circuit adjacent the second selection circuit in the memory system and having a fourth memory element and a fourth coupling circuit, the fourth memory element having an input controlled by the first control signal, a first output coupled to the fourth coupling circuit, and a second output, the fourth memory element: (1) being written to contain a first logic state to enable a primary line of memory cells in a memory array for use via the fourth coupling circuit; and (2) being written to contain a second logic state to enable an alternative line of memory cells in a memory array for use via the fourth coupling circuit.

21. The method of claim 20 wherein: (1) the memory elements of the first and third selection circuits are serially coupled together via the second outputs to form a first sequential chain of memory elements; and (2) the memory elements of the second and fourth selection circuits are serially coupled together via the second outputs to form a second sequential chain of memory elements.

22. A method for selecting memory in a memory array of a memory system, the method comprising the steps of:
  (a) programming a plurality of electrically-programmable memory elements in a plurality of selection circuits to select a first plurality of memory lines in the memory array, the step of programming enabling the memory array in a first memory configuration;

(b) functionally utilizing the memory system while in the first memory configuration for a functional period of time;

(c) performing test operations on the first memory configuration after the functional period of time to identify a location of a memory fault in the memory array; and (d) reprogramming the plurality of electrically-programmable memory elements in the plurality of selection circuits to select a second plurality of memory lines in the memory array to enable the memory array in a second memory configuration which is different from the first memory configuration whereby the second memory configuration avoids the memory fault identified in step (b).

23. The method of claim 22 wherein the step (c) determines a memory fault requiring correction by using a built-in-self-test (BIST) circuit located within the memory system where the BIST circuit is enabled to test the memory system after the functional utilization of step (b).

24. The method of claim 22 wherein the memory system is packaged into an integrated circuit package before the steps (c) and (d) are performed.

25. The method of claim 22 wherein the memory lines in the first and second plurality of memory lines are rows of a memory array.

26. The method of claim 22 wherein the memory lines in the first and second plurality of memory lines are columns of a memory array.

27. The method of claim 22 wherein the steps (c) and (d) are performed via an on-chip tester located on-chip with the memory array wherein the on-chip tester systematically writes and reads logical values to the memory array to find the fault in the memory system.

28. The method of claim 22 wherein the step (c) is automatically performed when the memory system is powered-up.

29. The method of claim 22 wherein the step (c) is automatically performed at specified periods of time.

30. The method of claim 22 wherein the step (d) requires that the plurality of electrically-programmable memory elements be reset before re-programming can occur.

31. The method of claim 22 wherein the first memory configuration contains active redundant memory cells.

32. The method of claim 22 wherein the second memory configuration contains active redundant memory cells which were not active in the first memory configuration.

33. A method for selecting memory in a memory array of a memory system, the method comprising the steps of:

(a) providing a memory array having lines of memory, the memory array also having redundant lines of memory which are provided to functionally replace non-functional lines of memory in the memory array;

(b) providing an array of electrically-programmable memory elements which are selectively programmed to enable or disable specific redundant lines of memory to functionally replace non-functional lines of memory in the memory array;

(c) using a test controller, which is on-chip with the memory array, to test each line of memory in the memory array;

(d) identifying a non-functional line of memory in the memory array via test operations performed by the test controller; and (e) simultaneously asserting a decode control signal that is associated with the non-functional line of memory and a fault control signal in order to change a state of at least one of the electrically-programmable memory elements within the array of electrically-programmable memory elements, the at least one of the electrically-programmable memory elements disabling the non-functional line of memory and enabling a specific redundant line of memory in response to an assertion of an engage control signal.

34. The method of claim 33 wherein the step (d) further comprises:

tracking all detected faults to determine if a subsequently detected fault is fixable via re-programming or non-fixable due to exhaustion of all available redundant capacity.

35. A memory system comprising:

a memory decoder;

a plurality of selection circuits coupled to the memory decoder, the plurality of selection circuits containing electrically erasable memory elements;

a memory array having plurality of primary memory lines coupled to the plurality of selection circuits and a plurality of redundant memory lines coupled to the plurality of selection circuits;

a sense amplifier for reading memory values from the memory array; and wherein, a fault control signal is used to alter logic states in the electrically erasable memory elements of the plurality of selection circuits, a reset control signal being used for electrically resetting the electrically erasable memory elements of the plurality of selection circuits, and an engage control signal for applying contents of the electrically erasable memory elements of the plurality of selection circuits to the memory array to select active memory lines from the plurality of primary memory lines and the plurality of redundant memory lines.

36. A memory system comprising:

a memory array comprising a plurality of main lines of memory and a plurality of redundant lines of memory;

a plurality of line selection circuits wherein one line selection circuit is used to enable one line of memory from either the main lines of memory or the redundant lines of memory via electrically-erasable locations within the plurality of line selection circuits; and conductive input and output lines which group the plurality of line selection circuits into a plurality of interleaved sequential chains where each interleaved sequential chain contains a unique two or more of the line selection circuits, wherein at least one redundant line of memory is associated with each interleaved sequential chain.

37. A method for selecting memory in a memory array of a memory system, the method comprising the steps of:

(a) programming a plurality of electrically-programmable memory elements in a plurality of selection circuits to select a first plurality of memory lines in the memory array, the step of programming enabling the memory array in a first memory configuration;

(b) performing test operations on the first memory configuration to identify a location of a memory fault in the memory array if a fault exists;

(c) if a fault exists, reprogramming the plurality of electrically-programmable memory elements in the plurality of selection circuits to select a second plurality of memory lines in the memory array to enable the memory array in a second memory configuration which is different from the first memory configuration whereby the second memory configuration avoids the memory fault identified in step (b); and (d) repeating steps (b) through (d) automatically at specific periods of time throughout operation of the memory system.

* * * * *